(12) United States Patent
Huang

(10) Patent No.: US 11,903,122 B2
(45) Date of Patent: Feb. 13, 2024

(54) ANTI-INTERFERENCE CIRCUIT BOARD AND TERMINAL

(71) Applicant: Huawei Technologies Co., Ltd., Shenzhen (CN)

(72) Inventor: Dong Huang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 347 days.

(21) Appl. No.: 17/430,940

(22) PCT Filed: Feb. 12, 2020

(86) PCT No.: PCT/CN2020/074784
§ 371 (c)(1),
(2) Date: Aug. 13, 2021

(87) PCT Pub. No.: WO2020/164494
PCT Pub. Date: Aug. 20, 2020

(65) Prior Publication Data
US 2022/0117077 A1   Apr. 14, 2022

(30) Foreign Application Priority Data
Feb. 15, 2019  (CN) .......................... 201910118178.9

(51) Int. Cl.
*H05K 1/02* (2006.01)
*H01F 27/28* (2006.01)
(Continued)

(52) U.S. Cl.
CPC ....... *H05K 1/0228* (2013.01); *H01F 27/2804* (2013.01); *H05K 1/144* (2013.01); *H05K 1/18* (2013.01); *H01F 2027/2809* (2013.01); *H05K 2201/093* (2013.01); *H05K 2201/0979* (2013.01); *H05K 2201/09245* (2013.01);
(Continued)

(58) Field of Classification Search
CPC ................................................... H05K 1/0228
See application file for complete search history.

(56) References Cited

U.S. PATENT DOCUMENTS 6,433,272 B1 * 8/2002 Buhler ..................... H04B 3/32
174/27
6,625,040 B1   9/2003 Tuttle
(Continued)

FOREIGN PATENT DOCUMENTS

CN        1773315 A       5/2006
CN      101185146 A       5/2008
(Continued)

*Primary Examiner* — Hung V Ngo
(74) *Attorney, Agent, or Firm* — Conley Rose, P.C.

(57) ABSTRACT

An anti-interference circuit board and a terminal, where the anti-interference circuit board includes a substrate having a first surface and a first region for placing a magnetometer is disposed on the first surface. A plurality of circuit layers are disposed in the substrate in a stacked manner. The first functional circuit and the second functional circuit are disposed to compensate for interference to the magnetometer in the first region, and during disposing, the first functional circuit and the second functional circuit are located below the magnetometer to reduce an occupied surface area of the anti-interference circuit board.

20 Claims, 12 Drawing Sheets

(51) Int. Cl.
*H05K 1/14* (2006.01)
*H05K 1/18* (2006.01)

(52) U.S. Cl.
CPC .............. *H05K 2201/09672* (2013.01); *H05K 2201/10151* (2013.01)

(56) References Cited

U.S. PATENT DOCUMENTS

| | | | |
|---|---|---|---|
| 2005/0133257 A1* | 6/2005 | Lauffer | H05K 1/0228 174/262 |
| 2006/0103768 A1 | 5/2006 | Yee et al. | |
| 2006/0226943 A1 | 10/2006 | Marques | |
| 2007/0235832 A1* | 10/2007 | Wang | H05K 1/0216 257/503 |
| 2010/0013471 A1 | 1/2010 | Boeve et al. | |
| 2010/0033175 A1* | 2/2010 | Boeve | H10N 50/10 324/252 |
| 2013/0214778 A1 | 8/2013 | Chen et al. | |
| 2013/0320972 A1 | 12/2013 | Loreit et al. | |
| 2017/0347445 A1* | 11/2017 | Barot | H05K 1/165 |
| 2018/0131846 A1 | 5/2018 | Miyamoto et al. | |
| 2018/0235076 A1 | 8/2018 | Kashiwakura et al. | |
| 2018/0245948 A1 | 8/2018 | Lindenberger et al. | |
| 2019/0346514 A1 | 11/2019 | Deak | |
| 2020/0084879 A1* | 3/2020 | Fukuchi | H05K 1/0243 |
| 2023/0298797 A1* | 9/2023 | Chen | H01F 17/06 336/200 |

FOREIGN PATENT DOCUMENTS

| | | |
|---|---|---|
| CN | 101308199 A | 11/2008 |
| CN | 103091649 A | 5/2013 |
| CN | 105101767 A | 11/2015 |
| CN | 107479010 A | 12/2017 |
| CN | 107535047 A | 1/2018 |
| CN | 107852829 A | 3/2018 |
| CN | 108267701 A | 7/2018 |
| DE | 102006031037 B3 | 10/2007 |
| EP | 1004033 B1 | 10/2002 |

* cited by examiner

Compensation magnetic field in a Y direction

ANTI-INTERFERENCE CIRCUIT BOARD AND TERMINAL

CROSS-REFERENCE TO RELATED APPLICATIONS

This is a U.S. National Stage of International Patent Application No. PCT/CN2020/074784 filed on Feb. 12, 2020, which claims priority to Chinese Patent Application No. 201910118178.9 filed on Feb. 15, 2019. Both of the aforementioned applications are hereby incorporated by reference in their entireties.

TECHNICAL FIELD

This application relates to the field of terminal technologies, and in particular, to an anti-interference circuit board and a terminal.

BACKGROUND

In a current mobile phone architecture solution, a magnetic environment is comparatively complex. In an entire system environment, a layout of a magnetometer serving as a geomagnetic field detection device is limited. It is difficult to find a location with small magnetic interference on a PCB. Therefore, a PCB design-based hardware compensation solution needs to be used to cancel some magnetic interference. In the conventional technology, when compensation is performed on a magnetometer, as shown in FIG. 1, a coil 3 is disposed on each of two sides of a magnetometer 2 on an anti-interference circuit board 1, and compensation is performed on the magnetometer 2 by using the coils 3. However, when this manner is used, a large area on the anti-interference circuit board 1 is occupied, and locations for placing other electronic devices on the anti-interference circuit board 1 are reduced.

SUMMARY

This application provides an anti-interference circuit board and a terminal, to mitigate interference to an electronic device on an anti-interference circuit board, and increase layout space of a device on the anti-interference circuit board.

According to a first aspect, an anti-interference circuit board is provided. The anti-interference circuit board is used in a terminal, and may be configured to carry a magnetometer. The anti-interference circuit board specifically includes a substrate. The substrate has two opposite surfaces. One of the surfaces is a first surface, and the first surface includes a first region. The first region is a region used for placing an electronic device. The electronic device is an electronic device susceptible to interference from a magnetic interference source, for example, a magnetometer. In addition, the substrate is a multi-layer substrate, a plurality of circuit layers are disposed in the substrate, and the plurality of circuit layers are disposed in a stacked manner. For example, the substrate includes a first circuit layer and a second circuit layer, and the first circuit layer and the second circuit layer are disposed in a stacked manner. During specific disposing, the first circuit layer includes a first functional circuit, where the first functional circuit is configured to generate a magnetic field in a first direction, and the first functional circuit includes a plurality of parallel first wires; and the second circuit layer includes a second functional circuit, where the second functional circuit is configured to generate a magnetic field in a second direction, and the second functional circuit includes a plurality of parallel second wires. The magnetic field generated in the first direction and the magnetic field generated in the second direction are used to cancel magnetic interference to the electronic device in a horizontal direction. Therefore, during disposing, vertical projections of the first functional circuit and the second functional circuit on the first surface cover the first region used for placing the electronic device. During use, the first functional circuit and the second functional circuit each include a port configured to electrically connect to the magnetic interference source. It can be learned from the foregoing descriptions that the first functional circuit and the second functional circuit are disposed to compensate for interference to the electronic device in the first region, and during disposing, the first functional circuit and the second functional circuit are located in the substrate below the electronic device, without occupying an area for placing a device on a surface of the substrate.

During specific disposing of the first functional circuit and the second functional circuit, the magnetic field generated in the first direction and the magnetic field generated in the second direction that are generated by the first functional circuit and the second functional circuit are at a specified included angle, so that magnetic fields in different directions may be generated according to a requirement. In a specific disposing manner, the magnetic field generated in the first direction and the magnetic field generated in the second direction are perpendicular to each other, so that magnetic interference to the electronic device can be cancelled in the two perpendicular directions.

During specific disposing of the first functional circuit and the second functional circuit, the first functional circuit and the second functional circuit meet the following when being stacked:

Along magnitudes of magnetic field interference to the magnetometer, a functional circuit that compensates for a magnetic field in a direction with largest interference is closer to the electronic device, so that the functional circuit can use a stronger magnetic field to compensate for interference to the magnetometer.

During specific disposing of the first functional circuit and the second functional circuit, the first functional circuit and the second functional circuit are connected in series or in parallel. To be specific, the first functional circuit and the second functional circuit may be connected in series, or the first functional circuit and the second functional circuit may be connected in parallel.

In a specific implementation solution, the first functional circuit has a first port and a second port, the first port is connected to one end of the plurality of parallel first wires, and the second port is connected to the other end of the plurality of parallel first wires; and the second functional circuit has a third port and a fourth port, the third port is connected to one end of the plurality of parallel second wires, and the fourth port is connected to the other end of the plurality of parallel second wires. When the first functional circuit and the second functional circuit are connected in series, the second port is electrically connected to the third port, the first port is configured to electrically connect to a first end of the magnetic interference source, and the fourth port is configured to electrically connect to a second end of the magnetic interference source. Alternatively, when the first functional circuit and the second functional circuit are connected in parallel, the first port and the third port are separately configured to electrically connect to the first end of the magnetic interference source, and the second port and the fourth port are separately configured to electrically connect to the second end of the magnetic interference source. In other words, the first functional circuit and the second functional circuit are electrically connected through the disposed ports.

During specific implementation of the series connection or the parallel connection, the ports of the first functional circuit and the second functional circuit are connected in series or in parallel through a via provided in the substrate. The first functional circuit and the second functional circuit may be conductively connected through the provided via. Certainly, other manners may be alternatively used, for example, different manners such as using a buried wire.

In a specific implementation solution, a third circuit layer is further disposed in the substrate, and the third circuit layer is stacked with the first circuit layer and the second circuit layer. The third circuit layer includes a third functional circuit configured to generate a vertical magnetic field. A vertical projection of the third functional circuit on the first surface covers the first region, and the third functional circuit includes a port configured to electrically connect to the magnetic interference source. The compensation vertical magnetic field is generated by the disposed third functional circuit.

During specific disposing of the third functional circuit, the third functional circuit includes a coil disposed in a horizontal spiral manner, and a fifth port and a sixth port are respectively disposed at two ends of the coil disposed in the horizontal spiral manner, thereby occupying a comparatively small area.

During specific disposing of the third functional circuit, a spiral coil that extends in a vertical direction, such as a step-shaped coil, may be used in the third functional circuit, and each of two ends of the coil also has a port, to electrically connect to the magnetic interference source.

During specific disposing of the first functional circuit, the second functional circuit, and the third functional circuit, any two of the first functional circuit, the second functional circuit, and the third functional circuit are connected in parallel or in series. To be specific, the first functional circuit, the second functional circuit, and the third functional circuit may be connected in series, or all the first functional circuit, the second functional circuit, and the third functional circuit may be connected in parallel. Alternatively, two of the functional circuits may be connected in series and then connected to the other functional circuit in parallel, or two of the functional circuits may be connected in parallel and then connected to the other functional circuit in series.

During specific implementation of the series connection or the parallel connection, when the first functional circuit includes the first port and the second port, and the second functional circuit includes the third port and the fourth port: when the first functional circuit, the second functional circuit, and the third functional circuit are connected in series, the first port is configured to electrically connect to the first end of the magnetic interference source, the second port is electrically connected to the third port, the fourth port is electrically connected to the fifth port, and the sixth port is configured to electrically connect to the second end of the magnetic interference source; or when the first functional circuit, the second functional circuit, and the third functional circuit are connected in parallel, the first port, the third port, and the fifth port are separately configured to electrically connect to the first end of the magnetic interference source, and the second port, the fourth port, and the sixth port are separately configured to electrically connect to the second end of the magnetic interference source. In other words, the functional circuits are connected in series or in parallel through the ports on the functional circuits.

During specific implementation of the series connection or the parallel connection, the ports of the first functional circuit, the second functional circuit, and the third functional circuit are connected in series or in parallel through a via provided in the substrate. The first functional circuit, the second functional circuit, and the third functional circuit are connected through the provided via.

During specific disposing of the first functional circuit, the second functional circuit, and the third functional circuit, the first functional circuit, the second functional circuit, and the third functional circuit all meet the following: Along magnitudes of magnetic field interference to the magnetometer, a functional circuit that compensates for a magnetic field in a direction with larger interference is closer to the magnetometer, so that the functional circuit can use a stronger magnetic field to compensate for interference to the magnetometer.

During specific electrical connection to a magnetic interference circuit, when the first functional circuit, the second functional circuit, and the third functional circuit are connected in series, the first port is connected to a first connection port configured to electrically connect to the first end of the magnetic interference source, and the sixth port is connected to a second connection port configured to electrically connect to the second end of the magnetic interference source.

According to a second aspect, a terminal is provided. The terminal includes the anti-interference circuit board and the magnetic interference source according to any one of the foregoing implementations. A first functional circuit and a second functional circuit are disposed to compensate for interference to an electronic device in a first region, and during disposing, the first functional circuit and the second functional circuit are located in a substrate below the electronic device, without occupying an area for placing a device on a surface of the substrate.

In a specific implementation solution, the magnetic interference source includes a circuit that can generate magnetic interference when a current flows on a terminal, for example, a charging circuit, a radio frequency circuit, or an audio circuit.

DESCRIPTION OF EMBODIMENTS

To make the objectives, technical solutions, and advantages of this application clearer, the following further describes this application in detail with reference to the accompanying drawings.

Figure 2:
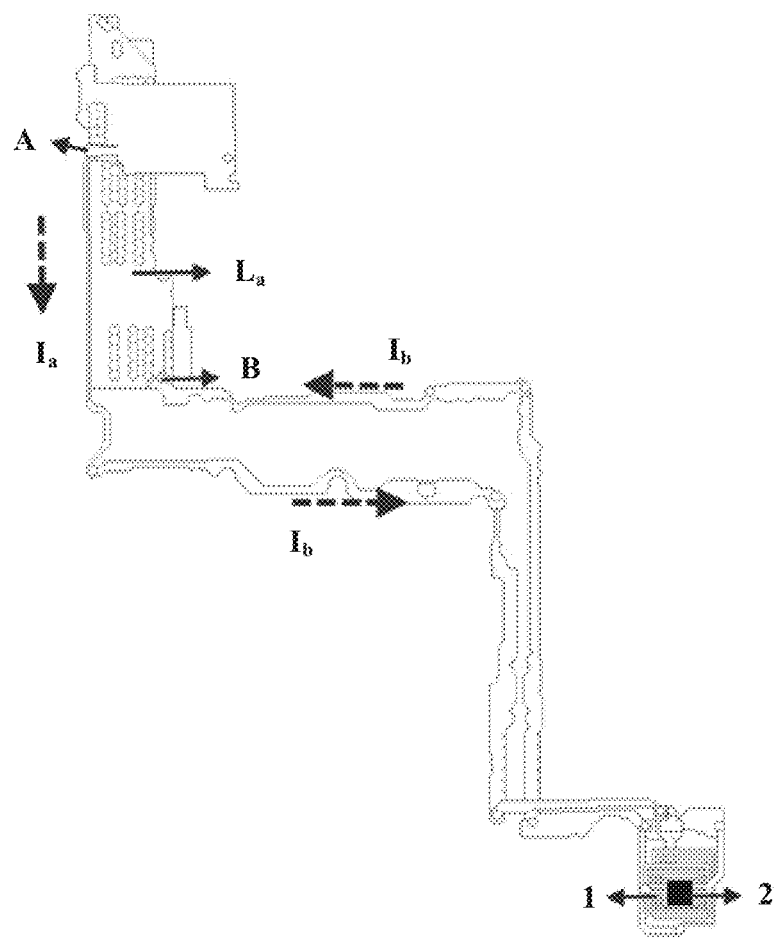
FIG. 2 is a principle diagram of a compensation magnetic field.

For ease of understanding an anti-interference circuit board provided in the embodiments of this application, an application scenario of the anti-interference circuit board is described first. The anti-interference circuit board is used in a terminal, for example, a mobile phone, a notebook computer, a tablet computer, or other common devices. The anti-interference circuit board is configured to carry an electronic device, and the electronic device is an electronic device susceptible to interference from a magnetic interference source, for example, a magnetometer. When the magnetometer is in use, the magnetometer is prone to some electromagnetic interference. For example, when a circuit on the anti-interference circuit board is operating, the circuit generates some interference magnetic fields, thereby limiting a layout of the magnetometer in an entire system environment. To improve an operating environment of the magnetometer, a compensation circuit for the magnetometer is disposed in the anti-interference circuit board in this application, to cancel interference caused by the circuit to the magnetometer. As shown in FIG. 2, a compensation magnetic field in a direction opposite to an interference magnetic field is generated through shunting at two ends (an end A and an end B) of a magnetic interference source La. A compensation current $Ib$ and a quantity N of turns of a compensation circuit are determined based on strength of the interference magnetic field. A flow direction of the compensation current $Ib$ is determined based on a direction of magnetic interference. A magnitude of the compensation current $Ib$ is adjusted by using feeding points of La: the end A and the end B. A coverage area of a compensation circuit 1 and a cabling width of the compensation circuit 1 are determined based on a size of a magnetometer 2, to ensure that the magnetometer 2 is in a uniform magnetic field in the middle of the compensation circuit 2.

Figure 3:
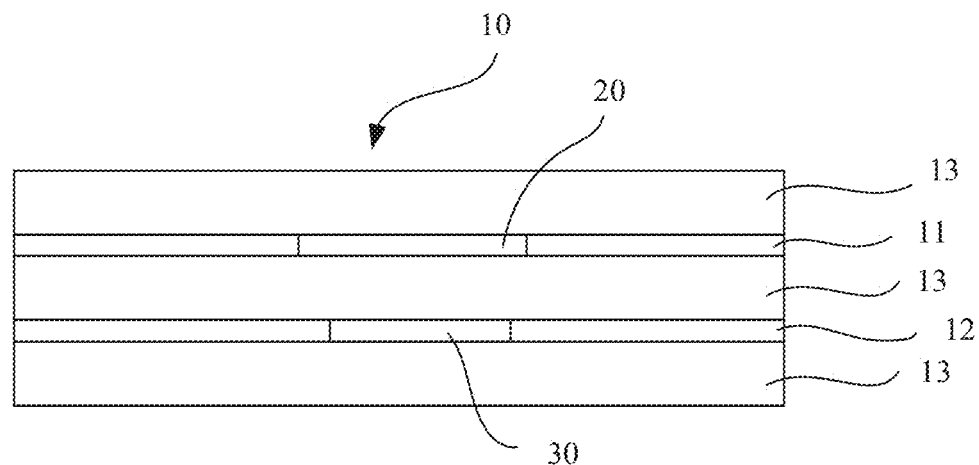
FIG. 3 is a schematic structural diagram of an anti-interference circuit board according to an embodiment of this application.
Figure 4:
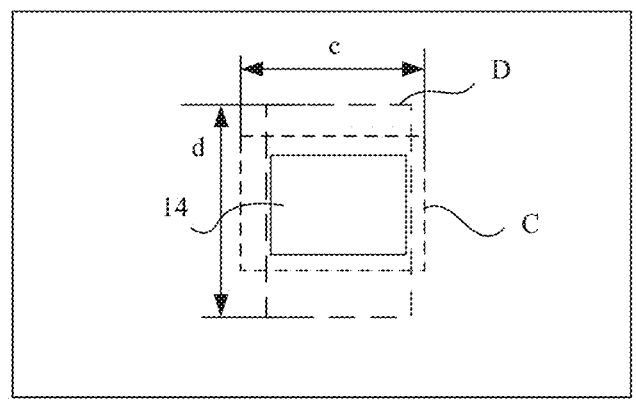
FIG. 4 is a top view of an anti-interference circuit board according to an embodiment of this application.

The anti-interference circuit board provided in the embodiments of this application is used in a terminal. When the anti-interference circuit board is used in the terminal, magnetic field interference is generated in the terminal. For example, when a charging circuit performs charging, a radio frequency circuit transmits a signal, or a speaker in an audio circuit generates sound, a generated current generates magnetic interference to a magnetometer. During cancellation, a magnetic interference source that has largest impact on the magnetometer may be selected for cancellation, or each magnetic interference source may be cancelled. It can be learned from the principle diagram shown in FIG. 2 that, when there are a plurality of magnetic interference sources, each magnetic interference source corresponds to one compensation circuit. For example, when there are two magnetic interference sources, two compensation circuits are correspondingly disposed, and each compensation circuit is correspondingly electrically connected to a corresponding interference source in a manner shown in FIG. 3. For ease of description, one magnetic interference source is used as an example for description. When there are a plurality of magnetic interference sources, corresponding compensation circuits need to be correspondingly disposed. As shown in FIG. 3, the anti-interference circuit board includes a substrate 10. The substrate 10 has a multi-layer structure, and includes a plurality of circuit layers. Using a placement direction of the anti-interference circuit board shown in FIG. 3 as a reference direction, the substrate 10 includes two opposite surfaces, and a surface located at a top layer is a first surface. FIG. 4 is a top view of the anti-interference circuit board in FIG. 3. The first surface has a first region 14 for placing a magnetometer. It can be learned from FIG. 4 that the first region 14 is a rectangular region. Certainly, the first region 14 may be alternatively in another shape, for example, may be a region in an elliptic shape, a pentagonal shape, a hexagonal shape, or other different shapes. When the magnetometer is placed in the first region 14, the magnetometer is connected to the substrate 10 through bonding or welding.

When a magnetic interference source operates, some circuits in the magnetic interference source generate electromagnetic interference to the magnetometer. The magnetic interference source is a magnetic interference device resulting from an operating current of each module in the terminal, for example, a charging circuit, an audio circuit, or other different devices. To eliminate the interference, as shown in FIG. 3, a compensation circuit configured to compensate for electromagnetic interference is disposed at the circuit layers in the substrate 10. The compensation circuit includes a first functional circuit 20 and a second functional circuit 30. The first functional circuit 20 is configured to generate a magnetic field generated in a first direction, and the second functional circuit 30 is configured to generate a magnetic field generated in a second direction. When the first functional circuit 20 and the second functional circuit 30 are disposed in the substrate 10, the first functional circuit 20 and the second functional circuit 30 are specifically disposed at the circuit layers in the substrate 10.

The substrate 10 includes a multi-layer structure. As shown in FIG. 3, during fabrication of the substrate 10, a dielectric layer 13 is first laid, then a copper layer is laid on the dielectric layer 13, then a circuit layer is formed through etching, then a dielectric layer 13 is laid on the circuit layer, and then another circuit layer is fabricated. The layers alternate successively to form the anti-interference circuit board. In the substrate 10 shown in FIG. 3, at least a first circuit layer 11 and a second circuit layer 12 that are stacked are disposed in the substrate 10, in other words, there are at least two circuit layers in the substrate 10. Certainly, a third circuit layer, a fourth circuit layer, and other different circuit layers may be further disposed in the substrate 10. During specific disposing of the first functional circuit 20 and the second functional circuit 30, the first functional circuit 20 is disposed at the first circuit layer 11, and the second functional circuit 30 is disposed at the second circuit layer 12. Both the first functional circuit 20 and the second functional circuit 30 are configured to generate horizontal magnetic fields.

Figure 5:
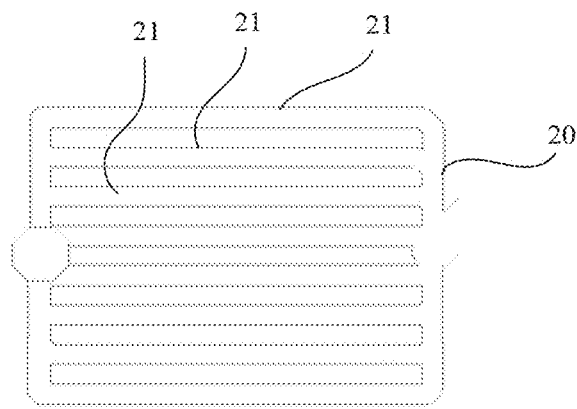
FIG. 5 is a schematic structural diagram of a first functional circuit according to an embodiment of this application.
Figure 6:
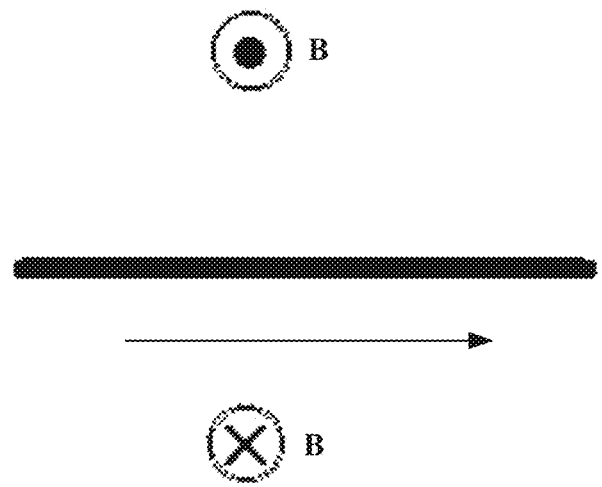
FIG. 6 is a schematic diagram of a magnetic field generated by a direct current according to an embodiment of this application.
Figure 7:
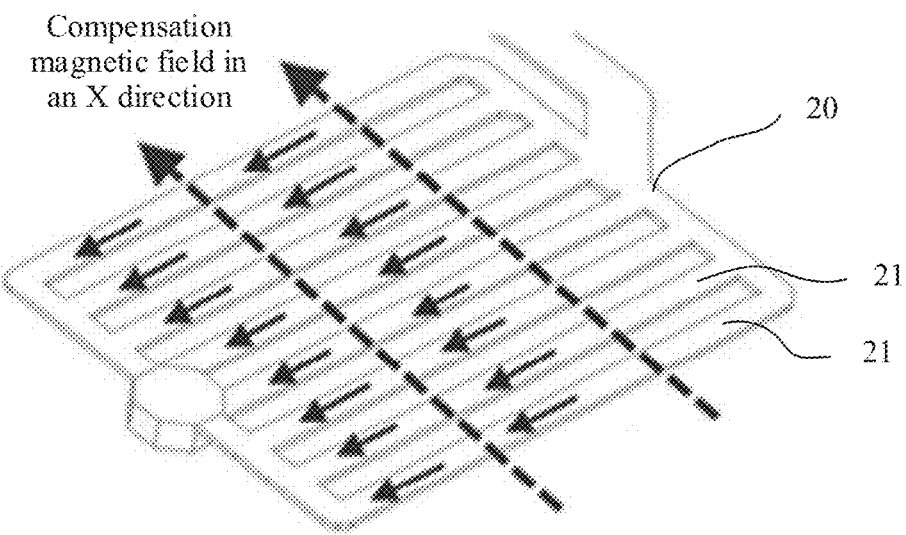
FIG. 7 is a schematic diagram of a magnetic field generated by a first functional circuit according to an embodiment of this application.

As shown in FIG. 5, in the first functional circuit 20 shown in FIG. 5, the first functional circuit 20 includes a plurality of parallel first wires 21, and the plurality of first wires 21 are straight wires. When being specifically formed at the first circuit layer 11, the first functional circuit 20 may be a printed circuit layer, for example, a copper clad layer. When a magnetic field is specifically generated, FIG. 6 shows a direction of a magnetic field generated when a current flows. It can be learned from a right-hand rule that, when a current flows from left to right, generated magnetic induction lines surround a wire, and directions of magnetic induction lines on both sides of the wire are shown in FIG. 6. A magnetic field above the wire points to an outer side of a paper surface, and a magnetic field below the wire points to an inner side of the paper surface. Therefore, in the structure shown in FIG. 5, when a plurality of straight wires are connected in parallel, because current directions in the straight wires are the same, directions of magnetic fields generated by all the straight wires are the same. When all the plurality of straight wires are conducted, magnetic fields generated by the straight wires are superposed to form a horizontal magnetic field. Specifically, FIG. 7 shows a direction of the magnetic field generated in the first direction. The direction of the magnetic field generated in the first direction is perpendicular to the first wires 21.

Figure 8:
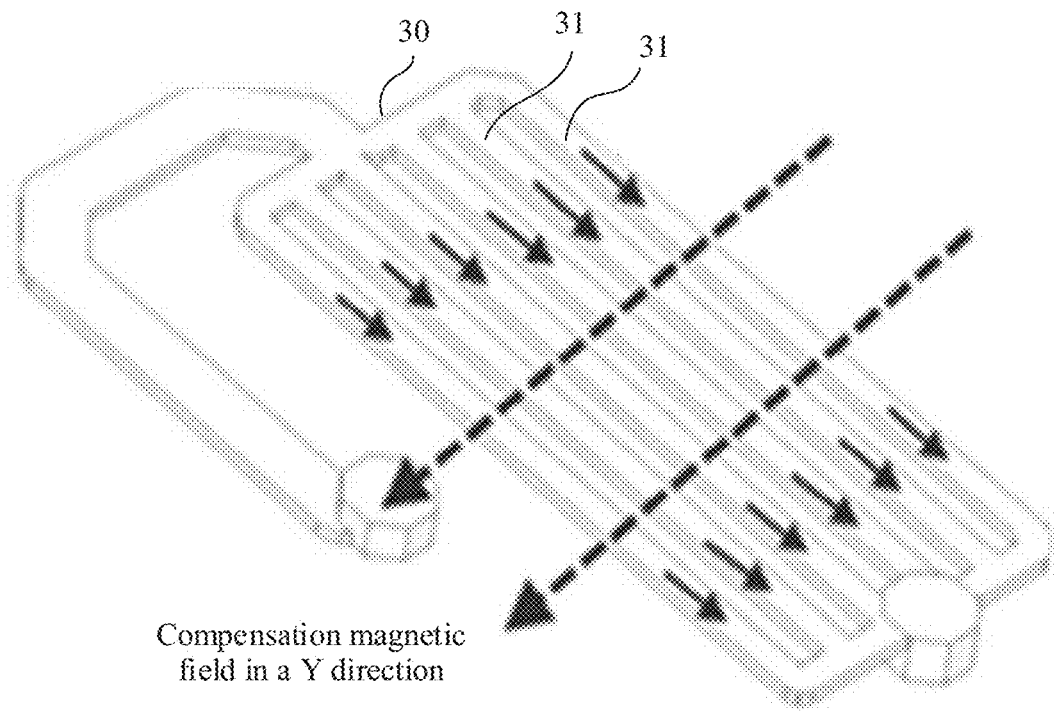
FIG. 8 is a schematic diagram of a magnetic field generated by a second functional circuit according to an embodiment of this application.

As shown in FIG. 8, in the second functional circuit 30 shown in FIG. 8, the second functional circuit 30 also includes a plurality of parallel second wires 31, and the plurality of second wires 31 are straight wires. When being specifically formed at the second circuit layer 12, the second functional circuit 30 may be a printed circuit layer, for example, a copper clad layer. When a magnetic field is specifically generated, as shown in FIG. 8, a direction of the magnetic field generated in the second direction is perpendicular to the second wires 31.

When electromagnetic compensation is performed on the magnetometer, as shown in FIG. 3, the first functional circuit 20 and the second functional circuit 30 are located below the first region 14. More specifically, the first region 14 is located in vertical projections of the first functional circuit 20 and the second functional circuit 30 on the first surface. Referring to FIG. 4, C is a vertical projection of the first functional circuit 20 on the first surface, and D is a vertical projection of the second functional circuit 30 on the first surface. It can be learned from FIG. 4 that the first region 14 is located in an overlapping region of the vertical projections of the first functional circuit 20 and the second functional circuit 30, so that the magnetic field generated in the first direction and the magnetic field generated in the second direction that are generated by the first functional circuit 20 and the second functional circuit 30 can be exerted on the magnetometer, to compensate for electromagnetic interference to the magnetometer.

It can be learned from FIG. 7 and FIG. 8 that directions of the magnetic field generated in the first direction and the magnetic field generated in the second direction are respectively perpendicular to length directions of the first wires 21 and the second wires 31. Therefore, during disposing of the first functional circuit 20 and the second functional circuit 30, directions of wires in the first functional circuit 20 and the second functional circuit 30 may be set based on a required direction of the magnetic field generated in the first direction and a required direction of the magnetic field generated in the second direction. In addition, during disposing, to compensate for interference from horizontal magnetic fields in different directions, the magnetic field generated in the first direction and the magnetic field generated in the second direction may be at a specified included angle. The specified included angle may be any included angle from 0 to 180, for example, 30°, 45°, 60°, 90°, 135°, 165°, or other angles in different directions. In a specific implementation solution, an included angle between the magnetic field generated in the first direction and the magnetic field generated in the second direction is 90°, in other words, the magnetic field generated in the first direction and the magnetic field generated in the second direction are perpendicular to each other. For ease of description, the direction of the magnetic field generated in the first direction is defined as an X direction, the direction of the magnetic field generated in the second direction is defined as a Y direction, and X and Y are two perpendicular directions on a horizontal plane.

The first functional circuit 20 and the second functional circuit 30 each are obtained by arranging, in parallel, copper wires with equal widths and equal spacings on one horizontal plane, and the copper wires need to cover a magnetic induction region of the magnetometer. In addition, during specific disposing, thinner copper wires and a smaller spacing indicate more uniform magnetic field distribution corresponding to the magnetometer induction region in the X direction or the Y direction, but more branches of the copper wires, and therefore less shunting of a single copper wire and a weaker compensation magnetic field; and thicker copper wires and a larger spacing indicate less uniform magnetic field distribution corresponding to the magnetometer induction region in the X direction or the Y direction, but fewer branches of the copper wires, and therefore more shunting of a single copper wire and a stronger compensation magnetic field. Therefore, during specific disposing of the first functional circuit 20 and the second functional circuit 30, a quantity of branches may be adjusted during actual use based on an area of the magnetometer induction region and a magnitude of magnetic interference.

During specific disposing of the first functional circuit 20 and the second functional circuit 30, as shown in FIG. 3, the first functional circuit 20 is disposed at the first circuit layer 11, and the second functional circuit 30 is disposed at the second circuit layer 12. The first circuit layer 11 is close to the magnetometer, and the second circuit layer 12 is farther away from the magnetometer than the first circuit layer 11. However, FIG. 3 shows merely a specific manner of disposing circuit layers. During disposing of the first functional circuit 20 and the second functional circuit 30, along magnitudes of magnetic field interference to the magnetometer, a functional circuit that compensates for a magnetic field in a direction with largest interference is closer to the magnetometer, so that the functional circuit can use a stronger magnetic field to compensate for interference to the magnetometer. If an X-axis magnetic field has comparatively strong interference, an X-axis compensation coil (the first functional circuit 20) is stacked above other coils, so that a compensation magnetic field is strengthened. Similarly, if the X-axis magnetic field has comparatively weak interference, the X-axis compensation coil (the first functional circuit 20) is stacked below the other coils, so that the compensation magnetic field is weakened. If a Y-axis magnetic field has comparatively strong interference, a Y-axis compensation coil (the second functional circuit 30) is stacked above other coils, so that a compensation magnetic field is strengthened. Similarly, if the Y-axis magnetic field has comparatively weak interference, the Y-axis compensation coil (the second functional circuit 30) is stacked below the other coils, so that the compensation magnetic field is weakened.

In addition, the first functional circuit 20 and the second functional circuit 30 may be specifically connected in series or in parallel. When the first functional circuit 20 and the second functional circuit 30 are connected in series, series circuit link impedance of coils is comparatively large, and in case of same voltage division, the compensation current Ib decreases, and the compensation magnetic field is weakened. Similarly, when the first functional circuit 20 and the second functional circuit 30 are connected in parallel, parallel circuit link impedance of coils is comparatively small, and in case of same voltage division, the compensation current Ib increases, and the compensation magnetic field is strengthened.

Figure 9:
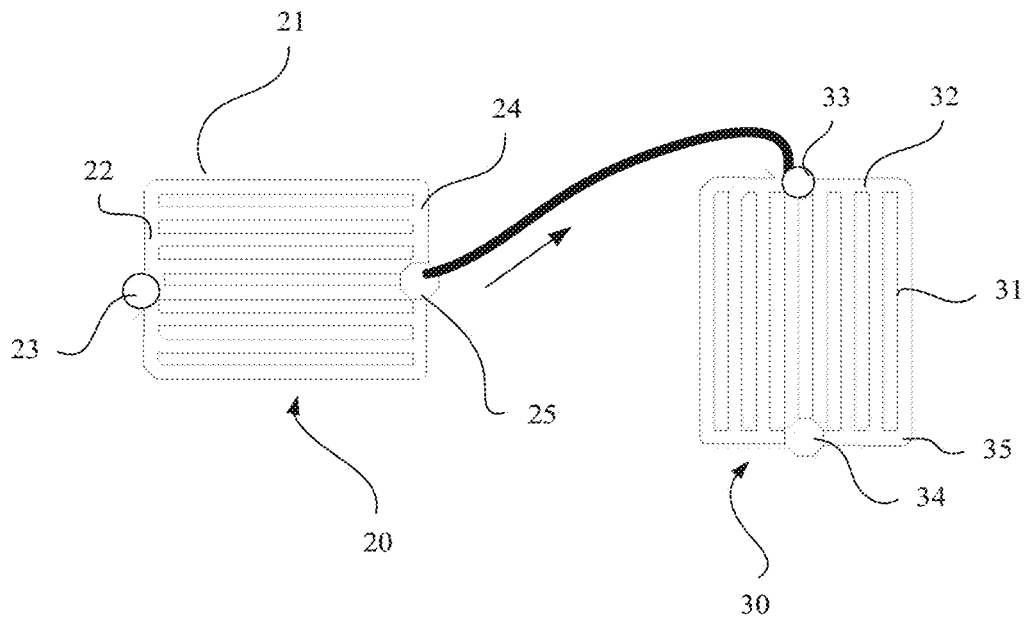
FIG. 9 is a schematic diagram of a first functional circuit and a second functional circuit connected in series according to an embodiment of this application.

When the first functional circuit 20 and the second functional circuit 30 are specifically connected in series or in parallel, as shown in FIG. 9, the first functional circuit 20 has a first port 23 and a second port 25. The first port 23 is connected to one end of a plurality of parallel first wires 21, and the second port 25 is connected to the other end of the plurality of parallel first wires 21. During specific disposing, ends of the plurality of first wires 21 are connected through a first connection line 22 perpendicular to the first wires 21, and the first port 23 is disposed on the first connection line 22; and the other ends of the first wires 21 are connected through a second connection line 24 perpendicular to the first wires 21, and the second port 25 is disposed on the second connection line 24. When the first functional circuit 20 is connected to another circuit, the first functional circuit 20 is electrically connected to the circuit through the first port 23 and the second port 25.

Figure 10:
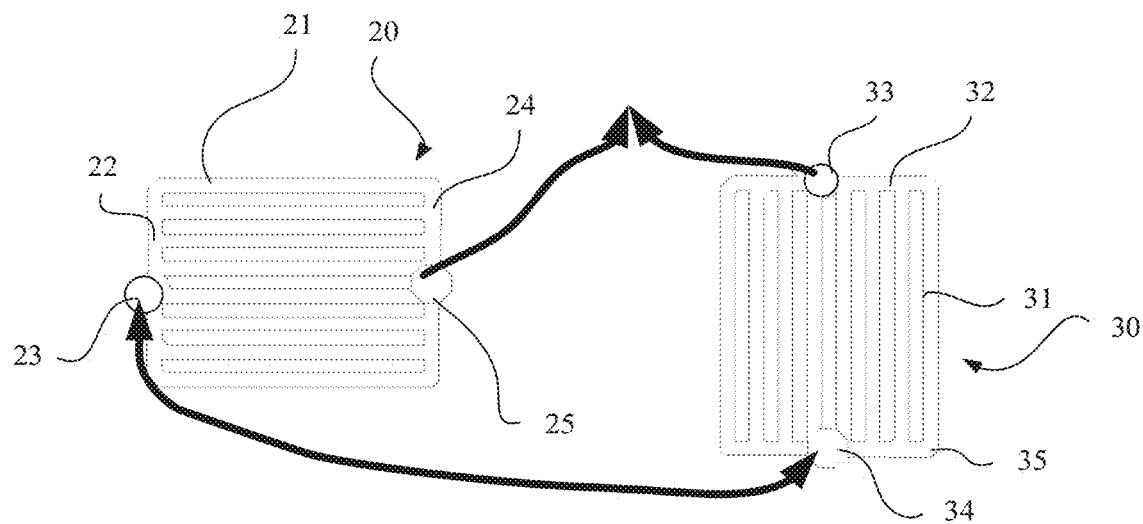
FIG. 10 is a schematic diagram of a first functional circuit and a second functional circuit connected in parallel according to an embodiment of this application.

A structure for the second functional circuit 30 is similar to that of the first functional circuit 20. For details, refer to FIG. 9. The second functional circuit 30 has a third port 33 and a fourth port 34. The third port 33 is connected to one end of a plurality of parallel second wires 31, and the fourth port is connected to the other end of the plurality of parallel second wires 31. During specific disposing, ends of the plurality of second wires 31 are connected through a third connection line 32 perpendicular to the second wires 31, and the third port 33 is disposed on the third connection line 32; and the other ends of the second wires 31 are connected through a fourth connection line 35 perpendicular to the second wires 31, and the fourth port 34 is disposed on the fourth connection line 35. When the second functional circuit 30 is connected to another circuit, the second functional circuit 30 is electrically connected to the circuit through the third port 33 and the fourth port 34. When the first functional circuit 20 and the second functional circuit 30 are connected in series, as shown in FIG. 9, the second port 25 is electrically connected to the third port 33, so that the first functional circuit 20 and the second functional circuit 30 are connected in series. A line with an arrow in FIG. 9 indicates a flow direction of a current. The first port 23 and the fourth port 34 are ports for the first functional circuit 20 and the second functional circuit 30 that are connected in series to electrically connect to the magnetic interference source. During specific connection, the first port 23 is configured to electrically connect to a first end of the magnetic interference source, and the fourth port 34 is configured to electrically connect to a second end of the magnetic interference source. When the first functional circuit 20 and the second functional circuit 30 are connected in parallel, as shown in FIG. 10, the first port 23 and the second port 25 of the first functional circuit 20, and the third port 33 and the fourth port 34 of the second functional circuit 30 are all ports for electrically connecting to the magnetic interference source. During connection, the first port 23 and the fourth port 34 are connected in parallel and then electrically connected to a first end of the magnetic interference source, and the second port 25 and the third port 33 are connected in parallel and then electrically connected to a second end of the magnetic interference source. An arrow shown in FIG. 10 indicates a flow direction of a current.

During specific connection, because the first functional circuit 20 and the second functional circuit 30 are located at different layers in the substrate 10, a series connection between the first functional circuit 20 and the second functional circuit 30 is implemented through a provided via. During specific implementation, refer to the foregoing descriptions about the substrate 10. For example, in the series connection, using a placement direction of the substrate 10 shown in FIG. 3 as a reference direction, during fabrication of the substrate 10, a second circuit layer 12 is fabricated on a dielectric layer 13, and a second functional circuit 30 is formed through etching at the second circuit layer 12. Then a dielectric layer 13 is laid, and a via is provided at the dielectric layer 13. The via is connected to a third port 33 of the second circuit layer 12. A first circuit layer 11 is laid on the dielectric layer 13, and a first functional circuit 20 is formed through etching at the first circuit layer 11. The via is connected to a second port 25 of the first functional circuit 20. In addition, the first port 23 of the first functional circuit 20 and the fourth port 34 of the second functional circuit 30 are separately configured to connect to a magnetic interference circuit. Specific connection may also be implemented in the foregoing manner using the via. In addition, when the parallel connection is used, two ends of the first functional circuit 20 are respectively connected to those of the second functional circuit 30 through a via.

Figure 1:
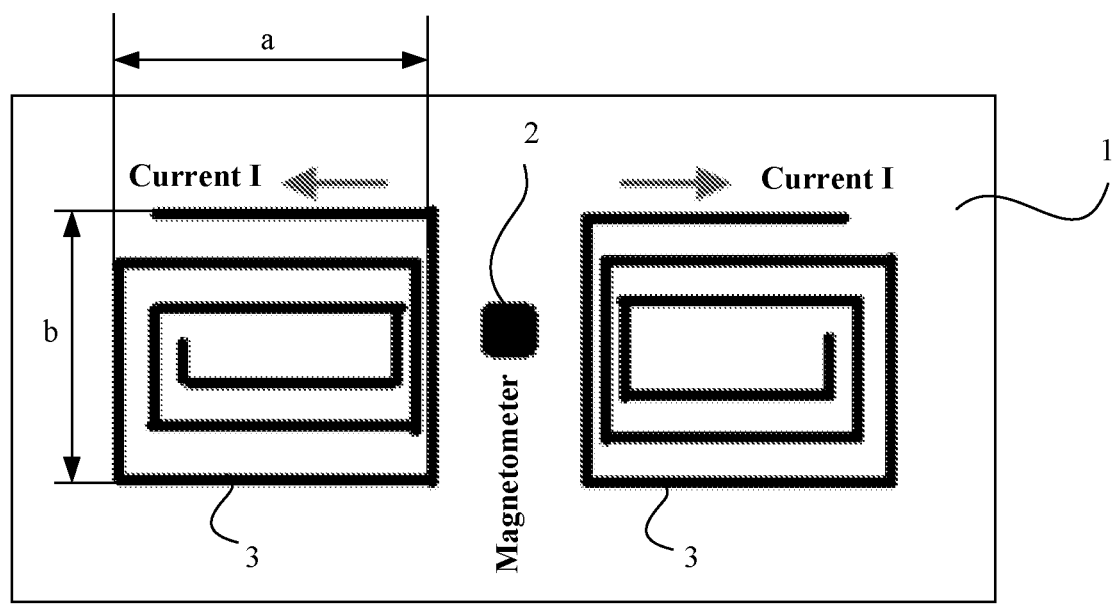
FIG. 1 is a schematic structural diagram of a compensation circuit in the conventional technology.

For ease of understanding an effect of the anti-interference circuit board provided in this embodiment of this application, refer to FIG. 1 and FIG. 4. FIG. 1 is a schematic diagram of an anti-interference circuit board in the conventional technology. In a structure shown in FIG. 1, a coil 3 is disposed on a surface (a surface on which a magnetometer 2 is disposed) of an anti-interference circuit board 1, and two coils 3 are disposed. An area occupied by each coil 3 is a x b, and a total area occupied by the two coils 3 is 2a x b. Referring to FIG. 3 and FIG. 4, the first functional circuit 20 and the second functional circuit 30 provided in this embodiment of this application are disposed in the substrate 10, without occupying space for disposing a device on a surface. In addition, during disposing, the first functional circuit 20 and the second functional circuit 30 are stacked with the magnetometer, thereby further reducing an occupied area. As shown in FIG. 4, an area occupied by the two functional circuits at a plane is c x d. Through comparison between FIG. 1 and FIG. 4, the area occupied by the functional circuits provided in this embodiment of this application is much smaller.

Figure 11:
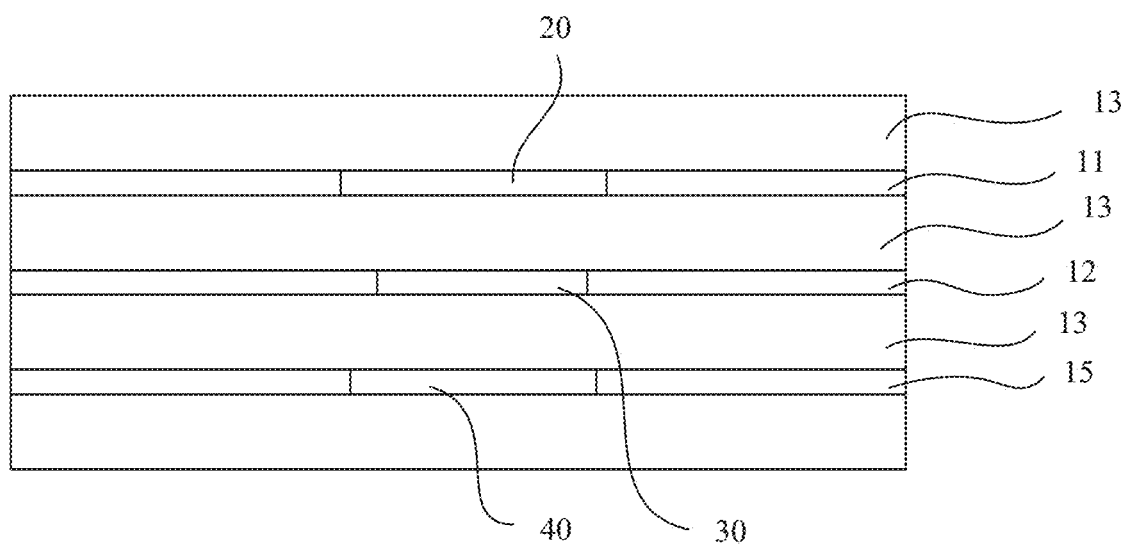
FIG. 11 is a schematic structural diagram of another anti-interference circuit board according to an embodiment of this application.
Figure 12:
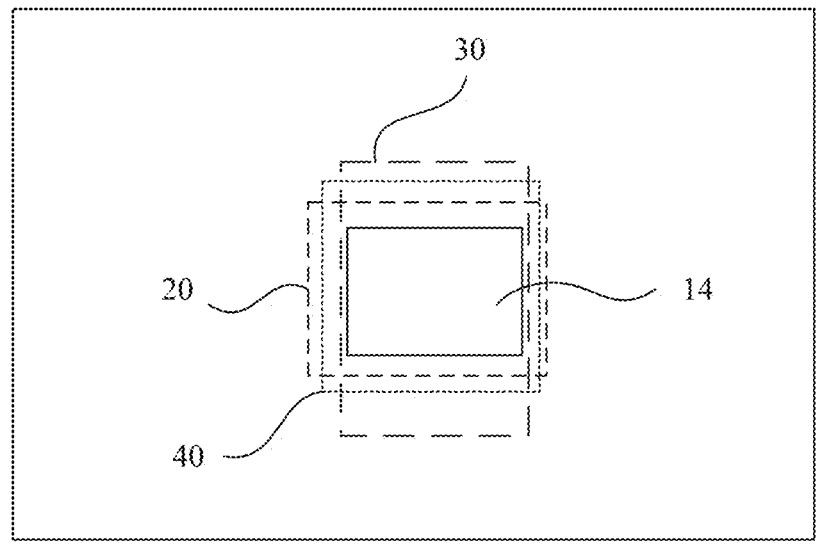
FIG. 12 is a top view of another anti-interference circuit board according to an embodiment of this application.

For an anti-interference circuit board shown in FIG. 11 and FIG. 12, a third circuit layer 15 is further disposed in the substrate 10 provided in this embodiment of this application. During specific disposing of the third circuit layer 15, the third circuit layer 15 is stacked with the first circuit layer 11 and the second circuit layer 12. A specific manner of disposing the third circuit layer 15 is the same as the foregoing manners of disposing the first circuit layer 11 and the second circuit layer 12, and details are not described herein again. In addition, corresponding to the third circuit layer 15, a third functional circuit 40 configured to generate a vertical magnetic field (a magnetic field in a Z-axis direction) is disposed at the third circuit layer 15, to compensate for magnetic field interference to the magnetometer in a vertical direction. As shown in FIG. 12, during specific disposing of the third functional circuit 40, a vertical projection of the third functional circuit on the first surface covers the first region 14, in other words, the first region 14 is also located in the vertical projection of the third functional circuit 40 on the first surface. In this case, the first region 14 is located in an overlapping region of the first functional circuit 20, the second functional circuit 30, and the third functional circuit 40 on the first surface, to ensure that the first functional circuit 20, the second functional circuit 30, and the third functional circuit 40 can provide a compensation magnetic field to improve an operating environment of the magnetometer.

Figure 13:
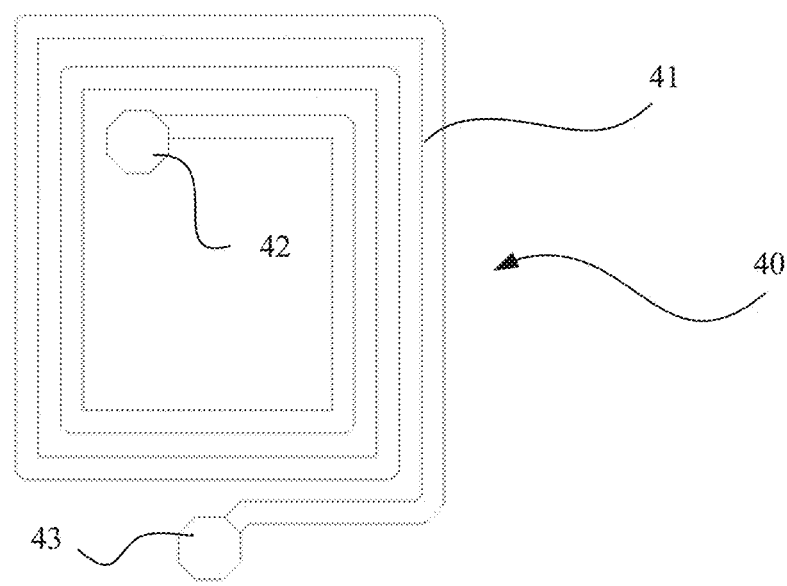
FIG. 13 is a schematic structural diagram of a third functional circuit according to an embodiment of this application.
Figure 14:
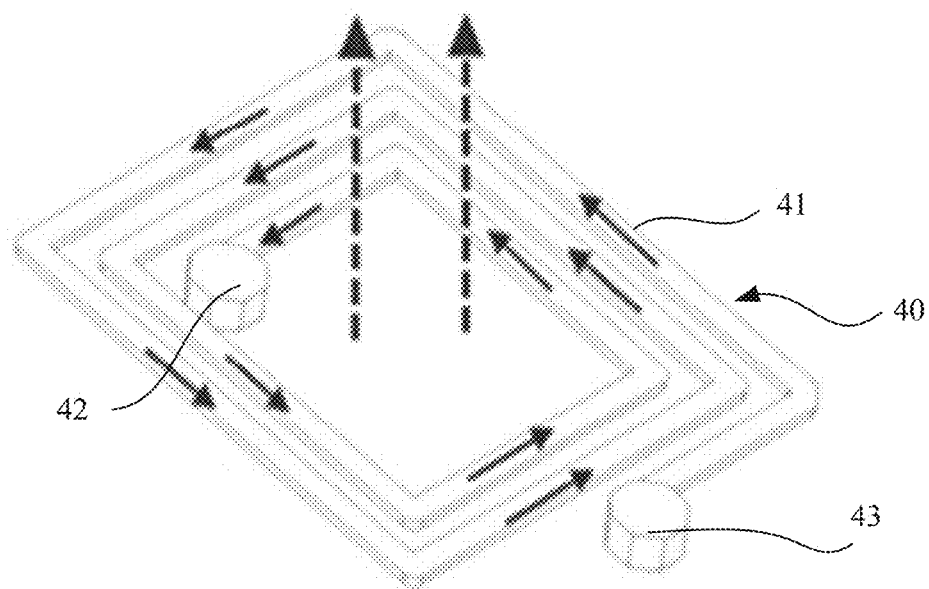
FIG. 14 is a schematic diagram of a magnetic field generated by a third functional circuit according to an embodiment of this application.

FIG. 13 shows a structure of the third functional circuit 40. The third functional circuit 40 includes a port configured to electrically connect to the magnetic interference source. In the structure shown in FIG. 13, the third functional circuit 40 includes a coil 41 disposed in a horizontal spiral manner, and a fifth port 42 and a sixth port 43 are separately disposed at two ends of the coil 41 disposed in the horizontal spiral manner. As shown in FIG. 14, the third functional circuit 40 generates a vertical magnetic field in a Z direction. Certainly, the third functional circuit 40 shown in FIG. 13 is merely a specific implementation. A spiral coil that extends in a vertical direction, such as a step-shaped coil, may be alternatively used in the third functional circuit 40. The coil can also form a vertical magnetic field in the Z direction. During specific disposing of the third functional circuit 40, a non-cabling region in a coil center covers a magnetometer induction region. In case of a same compensation current, a larger quantity of turns indicates a stronger compensation magnetic field, and contrarily, a smaller quantity of turns indicates a weaker compensation magnetic field.

During specific disposing of the first functional circuit 20, the second functional circuit 30, and the third functional circuit 40, any two of the first functional circuit 20, the second functional circuit 30, and the third functional circuit 40 are connected in parallel or in series. To be specific, the first functional circuit 20, the second functional circuit 30, and the third functional circuit 40 may be connected in series, or all the first functional circuit 20, the second functional circuit 30, and the third functional circuit 40 may be connected in parallel. Alternatively, two of the functional circuits may be connected in series and then connected to the other functional circuit in parallel, or two of the functional circuits may be connected in parallel and then connected to the other functional circuit in series.

Figure 15:
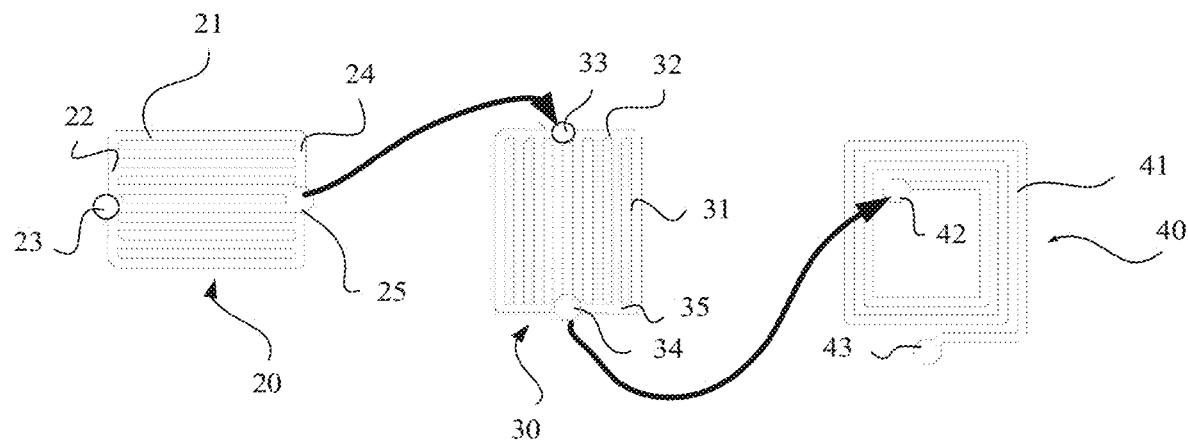
FIG. 15 is a schematic diagram of three functional circuits connected in series according to an embodiment of this application.
Figure 16:
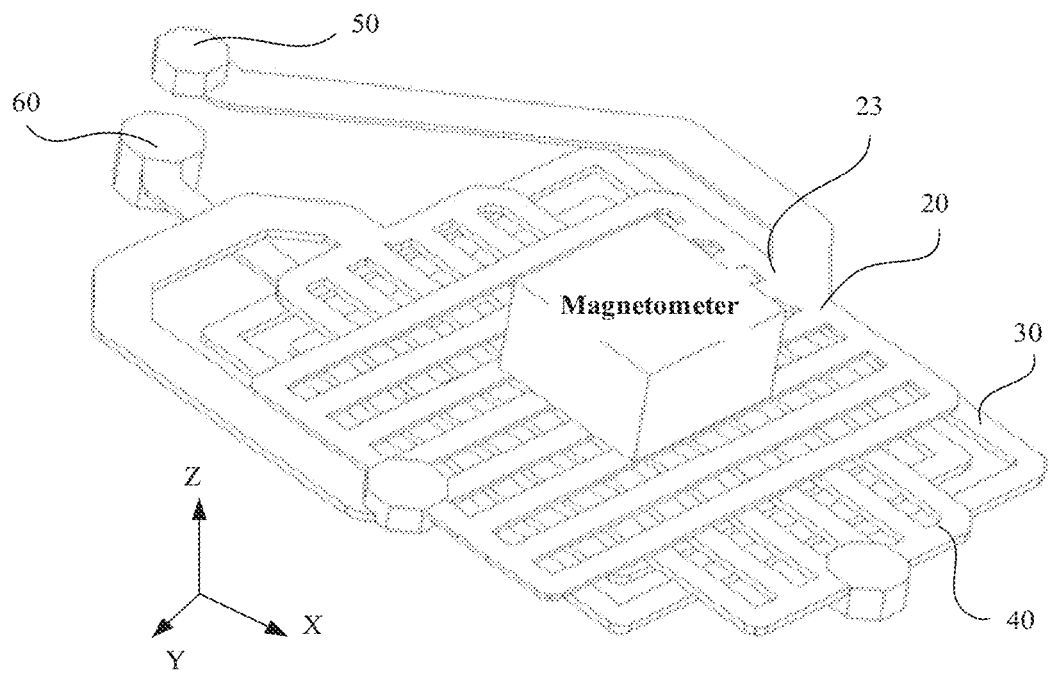
FIG. 16 is a schematic diagram of three functional circuits stacked according to an embodiment of this application.

During specific disposing, as shown in FIG. 15, when the first functional circuit 20, the second functional circuit 30, and the third functional circuit 40 are connected in series, the first port 23 is configured to electrically connect to the first end of the magnetic interference source, the second port 25 is electrically connected to the third port 33, the fourth port 34 is electrically connected to the fifth port 42, and the sixth port 43 is configured to electrically connect to the second end of the magnetic interference source. During specific connection, as shown in FIG. 15, the second port 25 is electrically connected to the third port 33 through a wire, the fourth port 34 is electrically connected to the fifth port 42 through a wire, the first port 23 is configured to electrically connect to the first end of the magnetic interference source, and the sixth port 43 is configured to electrically connect to the second end of the magnetic interference source. A direction with an arrow shown in FIG. 15 is a flow direction of a current. The flow direction is merely an example, and may be specifically adjusted according to a requirement. In addition, the connection manner between the ports is also merely an example, and may be specifically adjusted according to an actual requirement. For example, the first port 23 is connected to the third port 33, and the second port 25 is connected to the fifth port 42. In addition, to facilitate electrical connection to the magnetic interference source, as shown in FIG. 16, the first port 23 is connected to a first connection port 50 configured to electrically connect to the first end of the magnetic interference source, and the sixth port 43 is connected to a second connection port 60 configured to electrically connect to the second end of the magnetic interference source. During specific connection, the first connection port 50 and the second connection port 60 are electrically connected to the first end and the second end of the magnetic interference source through a via or a laid copper wire. For a specific connection manner, refer to the foregoing connection manners of the first functional circuit 20 and the second functional circuit 30.

Figure 17:
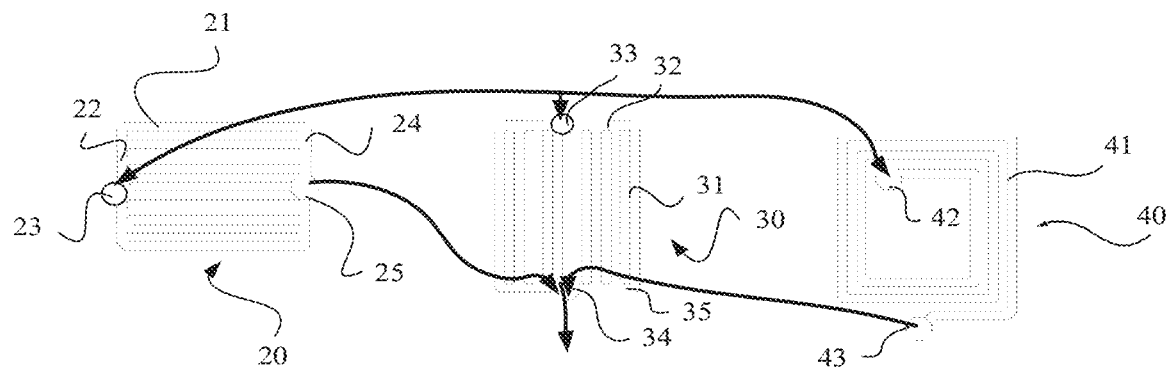
FIG. 17 is a schematic diagram of three functional circuits connected in parallel according to an embodiment of this application.

As shown in FIG. 17, when the first functional circuit 20, the second functional circuit 30, and the third functional circuit 40 are connected in parallel, the first port 23, the third port 33, and the fifth port 42 are separately configured to electrically connect to the first end of the magnetic interference source, and the second port 25, the fourth port 34, and the sixth port 43 are separately configured to electrically connect to the second end of the magnetic interference source. During specific connection, as shown in FIG. 17, the first port 23, the third port 33, and the fifth port 42 are electrically connected to the first end of the magnetic interference source, and the second port 25, the fourth port 34, and the sixth port 43 are electrically connected to the second end of the magnetic interference source. An arrow in the figure indicates a flow direction of a current. It should be understood that the current direction is an example, and during specific connection, the current direction may be adjusted according to a requirement.

Optionally, the first port 23, the third port 33, and the fifth port 42 may be configured to directly connect to the first end of the magnetic interference source, and the second port 25, the fourth port 34, and the sixth port 43 may be configured to directly connect to the first end of the magnetic interference source. The first port 23, the third port 33, and the fifth port 42 may be electrically connected to a port, and the port is configured to directly connect to the first end of the magnetic interference source. The second port 25, the fourth port 34, and the sixth port 43 may be electrically connected to another port, and the another port is configured to directly connect to the first end of the magnetic interference source.

During specific disposing, in specific implementation, the first functional circuit 20, the second functional circuit 30, and the third functional circuit 40 are connected in series or in parallel through a via provided in the substrate 10. For details, refer to the foregoing manner of connecting the first functional circuit 20 and the second functional circuit 30 through a via. Details are not described herein again.

In addition, for stacking between the first functional circuit 20, the second functional circuit 30, and the third functional circuit 40, also refer to the foregoing descriptions. Sorting is performed based on strength of interference magnetic fields corresponding to the magnetometer, and a stacking sequence of the three functional circuits meets the following: Along magnitudes of magnetic field interference to the magnetometer, a functional circuit that compensates for a magnetic field in a direction with larger interference is closer to the magnetometer, so that the functional circuit can use a stronger magnetic field to compensate for interference to the magnetometer.

During actual use, strength of the compensation magnetic field may be adjusted by changing the stacking sequence of the functional circuits, a quantity of turns of a Z-axis coil, and a quantity of X-axis coils and Y-axis coils that are laid in parallel. In addition, a feeding point of a coil current may be changed by using different PCB cabling designs, to change a direction of the compensation magnetic field, and compensate for the magnetometer.

Figure 18:
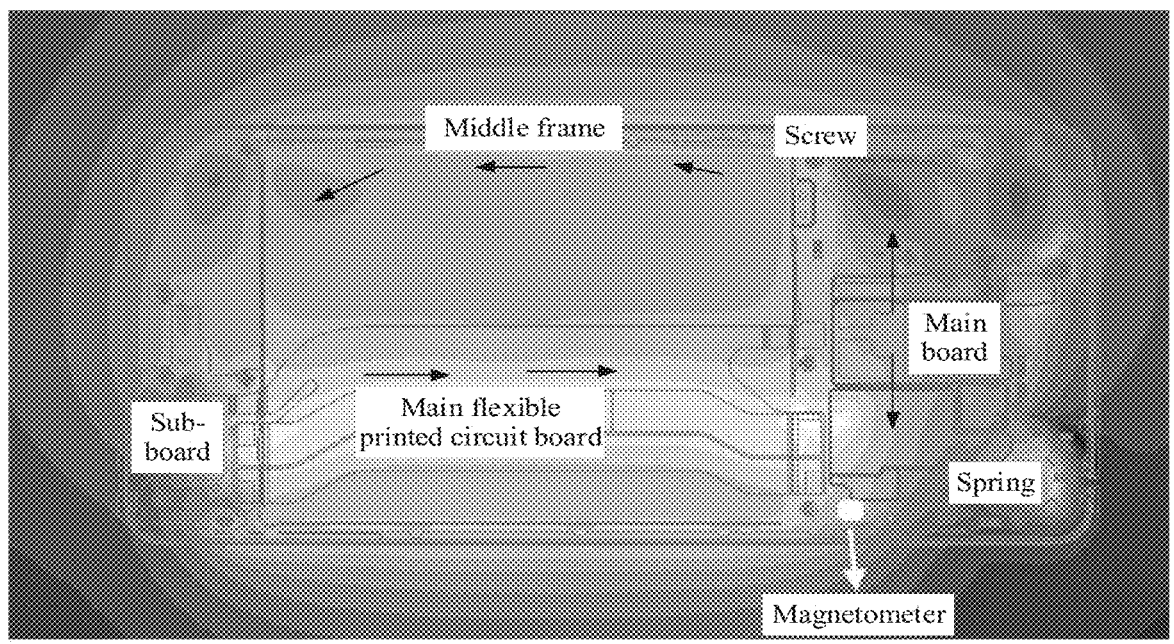
FIG. 18 is a schematic diagram of simulating charging electromagnetic interference according to an embodiment of this application.

For ease of understanding the anti-interference circuit board provided in this embodiment of this application, the following simulates a case in which the anti-interference circuit board is used in a terminal. Using a mobile phone as an example, when the mobile phone is charging, as shown in FIG. 18, a charging current enters from a USB port and passes through a main flexible printed circuit board →a main board →a spring →a middle frame →a spring →a subboard →a USB port (the foregoing structures are all internal structures of an existing mobile phone, and details are not described herein), to complete a current loop. Arrows pointing to the right indicate a charging current path, and other arrows indicate a return current path. Different grayscales in a simulation cloud map indicate different magnitudes of magnetic interference. A lighter color indicates severer interference.

Figure 19:
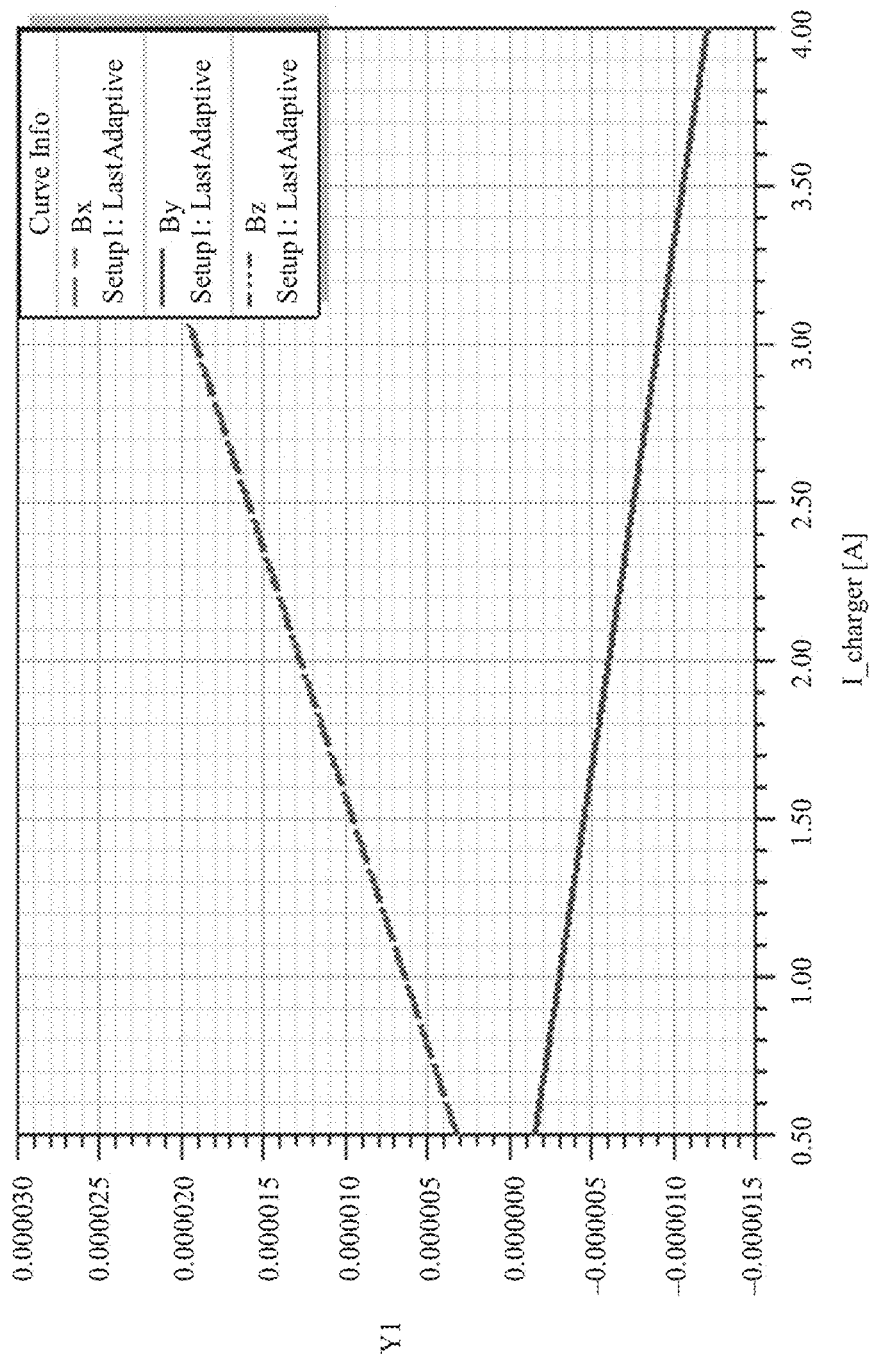
FIG. 19 is a schematic diagram of an interference current according to an embodiment of this application.
Figure 20:
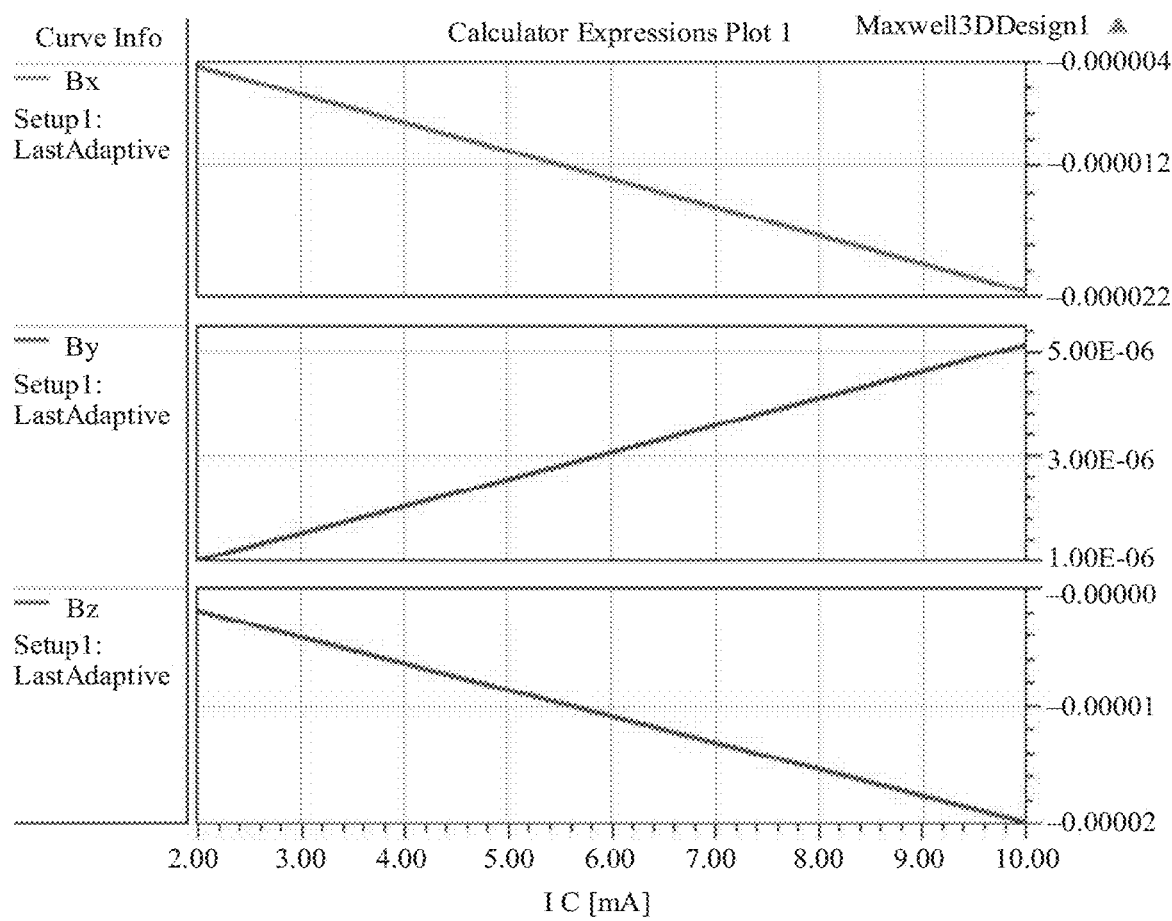
FIG. 20 shows simulation of a compensation result of three functional circuits according to an embodiment of this application.

FIG. 19 shows a simulation curve of magnetic interference, on an X axis, a Y axis, and a Z axis, to a magnetometer in an entire system state. A unit for a vertical axis is T (Tesla), and a unit for a horizontal axis is A (ampere). When a current changes from 0.6 A to 4 A, magnetic field changes in X-axis, Y-axis, and Z-axis directions are 4 uT to 26 uT, −2 uT to −12 uT, and 4 uT to 26 uT, respectively. FIG. 20 shows a simulation curve of magnetic fields generated by a compensation circuit on an X axis, a Y axis, and a Z axis at a location of a magnetometer. A unit for a vertical axis is T (Tesla), and a unit for a horizontal axis is A (ampere). When a compensation current Ib changes from 2 mA to 10 mA, magnetic field changes in X-axis, Y-axis, and Z-axis directions are −4 uT to −22 uT, 1 uT to 5 uT, and −2 uT to −20 uT, respectively. Through comparison between simulation results in FIG. 15 and FIG. 16, magnitudes of magnetic interference to the magnetometer in the entire system state on the X axis, the Y axis, and the Z axis change linearly with a current. When the current changes from 0.6 A to 4 A, a slope of a magnetic interference change curve in an X direction is positive, and absolute values of magnitudes of interference progressively increase; a slope of a magnetic interference curve in a Y direction is negative, and absolute values of magnitudes of interference progressively increase; a slope of a magnetic interference change curve in a Z direction is positive, and absolute values of magnitudes of interference progressively increase. In a coil-only state, magnetic compensation values on the X axis, the Y axis, and the Z axis change linearly with a compensation current. When the compensation current changes from 2 mA to 10 mA, a slope of a compensation magnetic field change curve in an X direction is negative, and absolute values of magnitudes of interference progressively increase; a slope of a compensation magnetic field change curve in a Y direction is positive, and absolute values of magnitudes of interference progressively increase; a slope of a compensation magnetic field change curve in a Z direction is negative, and absolute values of magnitudes of interference progressively increase. A compensation magnetic field corresponding to a compensation current value of 10 mA and an interference magnetic field that is on each axis and that corresponds to an interference current value of 3.4 A are in opposite directions, and have basically same strength.

In the foregoing example, the magnetic interference source may be disposed on the substrate 10, or may be disposed on another anti-interference circuit board. When the magnetometer and the magnetic interference source are disposed on the same substrate 1, the compensation circuit may be electrically connected to the magnetic interference source through a laid copper wire or a provided via. When the magnetometer and the magnetic interference source are disposed on different anti-interference circuit boards, the magnetic interference source may be electrically connected to the compensation circuit through a wire between the different anti-interference circuit boards. The foregoing connection manner belongs to a conventional circuit design, and details are not described herein.

In addition, one magnetic interference source is used as an example for description in the foregoing. When a plurality of magnetic interference sources are used, a plurality of compensation circuits may be disposed, and the plurality of compensation circuits may be disposed in the manner of burying in the substrate 10 in the foregoing example, and may be buried in the substrate 10 in a stacked manner. A disposing manner and a principle of the compensation circuits are similar to those of the compensation circuit in the foregoing example, and the compensation circuits may be disposed with reference to the manner of burying the compensation circuit in the foregoing example.

An embodiment of this application further provides a terminal. The terminal includes the anti-interference circuit board and the magnetic interference source according to any one of the foregoing implementations. The magnetic interference source includes a circuit that can generate magnetic interference when a current flows on a terminal, for example, a charging circuit, a radio frequency circuit, or an audio circuit. A first functional circuit 20 and a second functional circuit 30 are disposed to compensate for interference to a magnetometer in a first region 14, and during disposing, the first functional circuit 20 and the second functional circuit 30 are located below the magnetometer, thereby reducing an occupied surface area of the anti-interference circuit board.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An anti-interference circuit board comprising:
a substrate comprising:
a first surface comprising a first region for placing an electronic device to be susceptible to interference from a magnetic interference source;
a first circuit layer comprising a first functional circuit that is configured to generate a first magnetic field in a first direction, wherein the first functional circuit comprises:
a plurality of parallel first wires; and
a first port configured to electrically couple to the magnetic interference source; and
a second circuit layer comprising a second functional circuit that is configured to generate a second magnetic field in a second direction, wherein the second functional circuit comprises:
a plurality of parallel second wires; and
a second port configured to electrically couple to the magnetic interference source,
wherein the first circuit layer and the second circuit layer are disposed in a stacked manner,
wherein vertical projections of the first functional circuit and the second functional circuit on the first surface cover the first region.

2. The anti-interference circuit board of claim 1, wherein the first direction and the second direction are at an included angle.

3. The anti-interference circuit board of claim 2, wherein the first direction and the second direction are perpendicular to each other.

4. The anti-interference circuit board of claim 1, wherein the first functional circuit and the second functional circuit are coupled in series.

5. The anti-interference circuit board of claim 4, wherein the first functional circuit comprises:
the first port coupled to a first end of the first wires and electrically coupled to a second end of the magnetic interference source; and
a third port coupled to a third end of the parallel first wires,
wherein the second functional circuit comprises:
a fourth port coupled to a fourth end of the parallel second wires and electrically coupled to the third port; and
the second port coupled to a fifth end of the parallel second wires and electrically coupled to a sixth end of the magnetic interference source.

6. The anti-interference circuit board of claim 1, wherein the first functional circuit and the second functional circuit are coupled in parallel.

7. The anti-interference circuit board of claim 6, wherein the first functional circuit comprises:
the first port coupled to a first end of the parallel first wires; and
a third port coupled to a second end of the parallel first wires,
wherein the second functional circuit comprises:
the second port coupled to a third end of the parallel second wires; and
a fourth port coupled to a fourth end of the parallel second wires,
wherein the first port and the third port are separately electrically coupled to a fifth end of the magnetic interference source, and
wherein the second port and the fourth port are separately electrically coupled to a sixth end of the magnetic interference source.

8. The anti-interference circuit board of claim 1, further comprising a third circuit layer disposed in the substrate, wherein the third circuit layer is stacked with the first circuit layer and the second circuit layer, wherein the third circuit layer comprises a third functional circuit configured to generate a vertical magnetic field, wherein a vertical projection of the third functional circuit on the first surface covers the first region, and wherein the third functional circuit comprises a third port configured to electrically couple to the magnetic interference source.

9. The anti-interference circuit board of claim 8, wherein the third functional circuit further comprises:
a coil disposed in a horizontal spiral manner and comprising:
a first end; and
a second end;
a fourth port disposed at the first end; and
a fifth port disposed at the second end.

10. The anti-interference circuit board of claim 9, wherein two of the first functional circuit, the second functional circuit, and the third functional circuit are coupled in parallel.

11. The anti-interference circuit board of claim 10, wherein the first functional circuit comprises the first port and a sixth port, wherein the second functional circuit comprises the second port and a seventh port, wherein the first port, the second port, and the fourth port are separately electrically coupled to a third end of the magnetic interference source, and wherein the sixth port, the seventh port, and the fifth port are separately electrically coupled to a fourth end of the magnetic interference source.

12. The anti-interference circuit board of claim 9, wherein two of the first functional circuit, the second functional circuit, and the third functional circuit are coupled in series.

13. The anti-interference circuit board of claim 12, wherein the first functional circuit comprises the first port and sixth port, wherein the second functional circuit comprises the second port and a seventh port, wherein the first functional circuit, the second functional circuit, and the third functional circuit are coupled in series, wherein the first port is electrically coupled to a third end of the magnetic interference source, wherein the sixth port is electrically coupled to the second port, wherein the seventh port is electrically coupled to the fourth port, and wherein the fifth port is electrically coupled to a fourth end of the magnetic interference source.

14. A terminal comprising:
a magnetic interference source; and
an anti-interference circuit board comprising:
a substrate comprising:
a first surface comprising a first region for placing an electronic device to be susceptible to interference from the magnetic interference source;
a first circuit layer comprising a first functional circuit that is configured to generate a first magnetic field in a first direction, wherein the first functional circuit comprises:
a plurality of parallel first wires; and
a first port configured to electrically couple to the magnetic interference source; and
a second circuit layer comprising a second functional circuit that is configured to generate a second magnetic field in a second direction, wherein the second functional circuit comprises:

a plurality of parallel second wires; and
a second port configured to electrically couple to the magnetic interference source,
wherein the first circuit layer and the second circuit layer are disposed in a stacked manner,
wherein vertical projections of the first functional circuit and the second functional circuit on the first surface cover the first region, and
wherein the first functional circuit and the second functional circuit each comprises a port configured to electrically couple to the magnetic interference source.

15. The terminal of claim 14, wherein the first direction and the second direction are at an included angle.

16. The terminal of claim 14, wherein the first direction and the second direction are perpendicular to each other.

17. The terminal of claim 14, wherein the first functional circuit and the second functional circuit are coupled in series.

18. The terminal of claim 17, wherein the first functional circuit comprises:
the first port coupled to a first end of the parallel first wires and electrically coupled to a second end of the magnetic interference source; and
a third port coupled to a third end of the parallel first wires,
wherein the second functional circuit comprises:
a fourth port coupled to a fourth end of the parallel second wires and electrically coupled to the third port; and
the second port coupled to a fifth end of the parallel second wires and electrically coupled to a sixth end of the magnetic interference source.

19. The terminal of claim 14, wherein the first functional circuit and the second functional circuit are coupled in series.

20. The terminal of claim 19, wherein the first functional circuit comprises:
the first port coupled to a first end of the parallel first wires and electrically coupled to a second end of the magnetic interference source; and
a third port coupled to a third end of the parallel first wires,
wherein the second functional circuit comprises:
a fourth port coupled to a fourth end of the parallel second wires and electrically coupled to the third port; and
the second port coupled to a fifth end of the parallel second wires and electrically coupled to a sixth end of the magnetic interference source.

* * * * *